(12) United States Patent
Marchack et al.

(10) Patent No.: US 11,980,039 B2
(45) Date of Patent: May 7, 2024

(54) WIDE-BASE MAGNETIC TUNNEL JUNCTION DEVICE WITH SIDEWALL POLYMER SPACER

(71) Applicant: INTERNATIONAL BUSINESS MACHINES CORPORATION, Armonk, NY (US)

(72) Inventors: Nathan P. Marchack, New York, NY (US); Chandrasekharan Kothandaraman, New York, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 17/304,179

(22) Filed: Jun. 16, 2021

(65) Prior Publication Data
US 2022/0406841 A1   Dec. 22, 2022

(51) Int. Cl.
*H10B 61/00* (2023.01)
*H10N 50/01* (2023.01)
(Continued)

(52) U.S. Cl.
CPC ............ *H10B 61/00* (2023.02); *H10N 50/01* (2023.02); *H10N 50/10* (2023.02); *H10N 50/80* (2023.02)

(58) Field of Classification Search
CPC .. H10B 61/00; H10N 50/01; H10N 50/00–10; H10N 50/80
(Continued)

(56) References Cited

U.S. PATENT DOCUMENTS 8,133,363 B2   3/2012  Lin
10,629,802 B1 * 4/2020  Chiu .................... H10N 50/01
(Continued)

FOREIGN PATENT DOCUMENTS

CN   104134748 A  * 11/2014
CN   104134748 A    11/2014
(Continued)

OTHER PUBLICATIONS

Jack Bass and William P Pratt Jr, J. Phys.:Condes Matter, (Apr. 4, 2007), IOP Publishing, vol. 19, pp. 183201 (Year: 2007).*
(Continued)

*Primary Examiner* — Marcos D. Pizarro
(74) *Attorney, Agent, or Firm* — L. Jeffrey Kelly; Yuanmin Cai

(57) ABSTRACT

A semiconductor device including a second magnetic tunnel junction stack aligned above a spin conductor layer above a first magnetic junction stack, a sidewall dielectric surrounding the second magnetic tunnel junction stack, a vertical side surface of the sidewall dielectric is aligned with vertical side surfaces of the spin conductor layer and the first magnetic junction stack. A method including forming a first magnetic tunnel junction stack, a spin conductor layer and a second magnetic tunnel junction stack, patterning the second magnetic tunnel junction stack, while not patterning the spin conductor layer and the first magnetic tunnel junction stack, forming a sidewall dielectric and a polymer layer on the sidewall dielectric. A method including patterning a second magnetic tunnel junction stack, while not patterning a spin conductor layer below the second magnetic tunnel junction stack nor a first magnetic tunnel junction stack below the spin conductor layer.

20 Claims, 10 Drawing Sheets

(51) Int. Cl.
*H10N 50/10* (2023.01)
*H10N 50/80* (2023.01)

(58) Field of Classification Search
USPC .......................................... 257/427
See application file for complete search history.

(56) References Cited

U.S. PATENT DOCUMENTS

| | | | |
|---|---|---|---|
| 10,707,413 | B1 | 7/2020 | Dutta |
| 2004/0127054 | A1* | 7/2004 | Lee ................. H10N 50/01 |
| | | | 438/712 |
| 2010/0053823 | A1* | 3/2010 | Iwayama .............. G11C 11/161 |
| 2010/0327248 | A1* | 12/2010 | Khoueir ................ H10N 50/01 |
| | | | 257/E47.001 |
| 2014/0015080 | A1 | 1/2014 | Kang |
| 2016/0351799 | A1 | 12/2016 | Xue |
| 2018/0269384 | A1 | 9/2018 | Wang |
| 2019/0189914 | A1 | 6/2019 | Miyazoe |
| 2020/0066791 | A1 | 2/2020 | Hu |
| 2020/0144488 | A1 | 5/2020 | Sundar |
| 2020/0185016 | A1* | 6/2020 | Sakhare ................ H10N 50/80 |
| 2020/0220073 | A1 | 7/2020 | Marchack |
| 2021/0057639 | A1* | 2/2021 | Ku ........................ H10N 50/10 |
| 2022/0131070 | A1* | 4/2022 | Lin ........................ H10B 61/00 |

FOREIGN PATENT DOCUMENTS

| | | | | |
|---|---|---|---|---|
| CN | 105374936 | A * | 3/2016 | ........... G11C 11/161 |
| CN | 105374936 | A | 3/2016 | |
| CN | 107623069 | A | 1/2018 | |
| CN | 107623096 | A * | 1/2018 | |
| WO | 2022262533 | A1 | 12/2022 | |

OTHER PUBLICATIONS

Coelho, "Double barrier magnetic tunnel junctions for innovative spintronic devices", Submitted on Feb. 22, 2019, Part 1, Part 1, 25 pages.
Coelho, "Double barrier magnetic tunnel junctions for innovative spintronic devices", Submitted on Feb. 22, 2019, Part 1, Part 2, 25 pages.
Coelho, "Double barrier magnetic tunnel junctions for innovative spintronic devices", Submitted on Feb. 22, 2019, Part 1, Part 3, 25 pages.
Coelho, "Double barrier magnetic tunnel junctions for innovative spintronic devices", Submitted on Feb. 22, 2019, Part 1, Part 4, 25 pages.
Coelho, "Double barrier magnetic tunnel junctions for innovative spintronic devices", Submitted on Feb. 22, 2019, Part 1, Part 5, 22 pages.
Coelho, "Double barrier magnetic tunnel junctions for innovative spintronic devices", Submitted on Feb. 22, 2019, Part 2, 81 pages.
Pending U.S. Appl. No. 17/128,330, filed Dec. 21, 2020, entitled: "Double Magnetic Tunnel Junction Device", 31 pages.
Notification of Transmittal of the International Search Report and the Written Opinion of the International Searching Authority, or the Declaration, dated Aug. 23, 2022, Applicant's or agent's file reference F22W2033, International application No. PCT/CN2022/094686, 9 pages.

* cited by examiner

100

| 106 | 108 | 106 |
|-----|-----|-----|
| 102 | 104 | 102 |

*Figure 1*

WIDE-BASE MAGNETIC TUNNEL JUNCTION DEVICE WITH SIDEWALL POLYMER SPACER

BACKGROUND

The present invention relates, generally, to the field of semiconductor manufacturing, and more particularly to fabricating a magnetic tunnel junction device with a wide-base.

Magnetoresistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet or a reference layer set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment, a semiconductor device is provided. The semiconductor device including a second magnetic tunnel junction stack aligned above a spin conductor layer aligned above a first magnetic junction stack, a sidewall dielectric surrounding the second magnetic tunnel junction stack, where a vertical side surface of the sidewall dielectric is aligned with vertical side surfaces of the spin conductor layer and the first magnetic junction stack According to an embodiment, a method is provided. The method including forming a first magnetic tunnel junction stack, forming a spin conductor layer above the first magnetic tunnel junction stack, forming a second magnetic tunnel junction stack above the spin conductor layer, patterning the second magnetic tunnel junction stack, while not patterning the spin conductor layer and the first magnetic tunnel junction stack, forming a sidewall dielectric on the second magnetic tunnel junction stack and on the spin conductor layer, and forming a polymer layer on the sidewall dielectric.

According to an embodiment, a method is provided. The method including patterning a second magnetic tunnel junction stack, while not patterning a spin conductor layer below the second magnetic tunnel junction stack nor a first magnetic tunnel junction stack below the spin conductor layer.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 1 illustrates a cross-sectional view of a semiconductor structure at an intermediate stage of fabrication, according to an exemplary embodiment;

Figure 2:
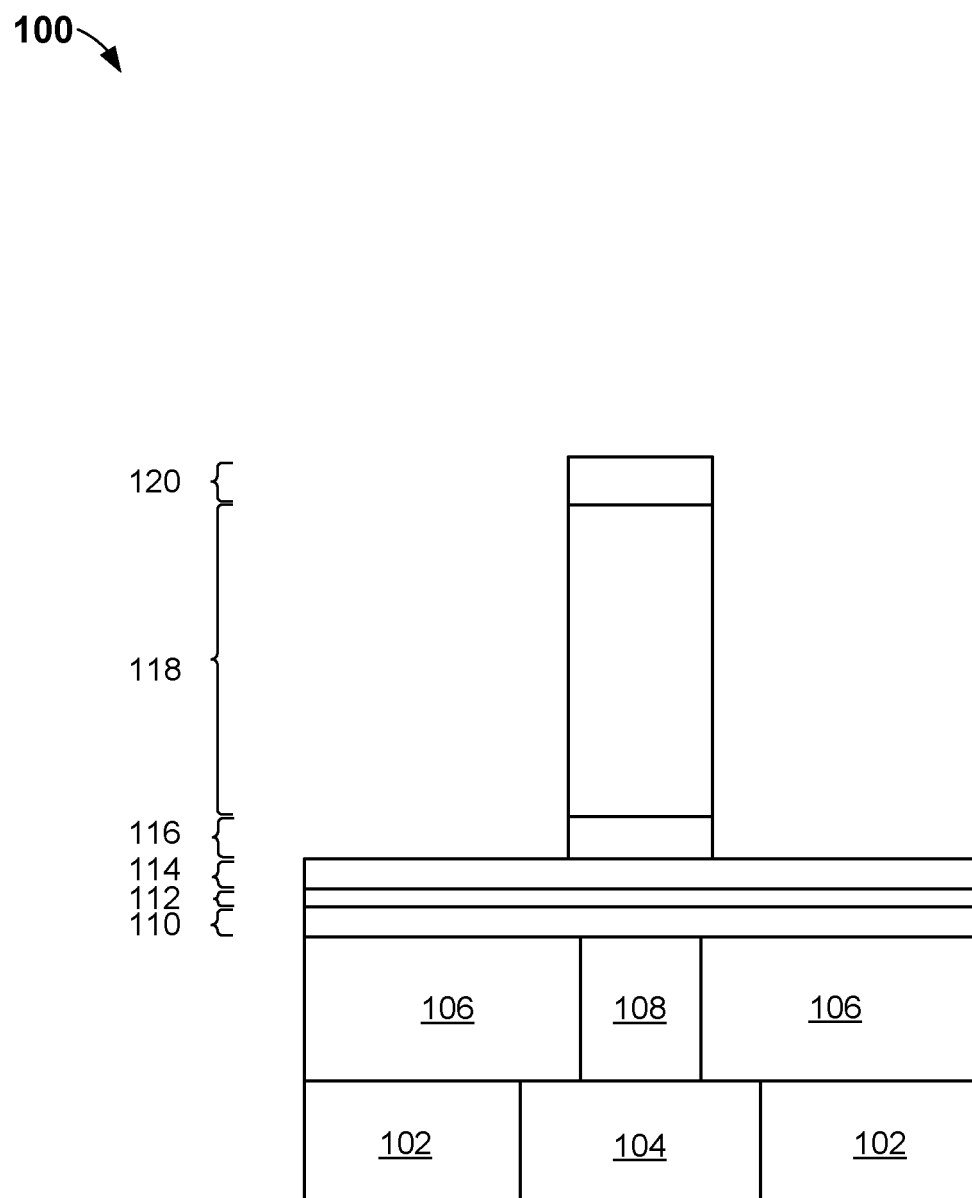
FIG. 2 illustrates fabrication of magnetoresistive random-access memory ("MRAM") stack layers and hard mask deposition, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magnetoresistive random-access memory ("MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet or a reference layer set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (MTJ) and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The present application relates to magnetoresistive random access memory (MRAM). More particularly, the present application relates to a modified double magnetic tunnel junction (mDMTJ) structure that can improve the performance of spin-transfer torque (STT) MRAM and which can be integrated into the back-end-of-the-line (BEOL) processing of semiconductor technologies (such as CMOS technologies). One type of MRAM that can use MTJ is spin-transfer torque MRAM (hereinafter "MTT-MRAM"). STT MRAM has an advantages of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ structure is used to switch, or "write" the bit-state of the MTJ memory element. A current passing down through the MTJ structure makes the magnetic free layer parallel to the magnetic reference layer, while a current passed up through the MTJ structure makes the magnetic free layer anti-parallel to the magnetic reference layer.

In STT MRAMs, it is desirable to reduce a switching current to match a small transistor size, which helps improve memory area density. One method of reducing the switching current by about 2× is a double magnetic tunnel junction (DMTJ) structure. A DMTJ may have a lower or first MTJ stack which may be wider than an upper or second MTJ stack. In an embodiment, the first MTJ stack may be double a size of the second MTJ stack. The DMTJ may be referred to as having a wide-base, where the first MTJ stack is larger than the second MTJ stack.

In certain DMTJ devices, a wide non-magnetic base modified DMTJ device is used to increase the MTJ's switching efficiency by eliminating both the resistance area ("RA") penalty and magnetoresistance ("MR") penalty that are both associated with standard DMTJs that have top and bottom MTJs with similar critical-dimensions ("CD"). These types of wide based devices provide double spin-current sourcing ("DSTT") benefits. Also, for these types of devices, the bottom barrier layer can have a relatively high RA. These devices leverage spin-diffusion transport in a non-magnetic ("NM") metal layer of the lower MTJ stack and can a achieve a reduction in the charge current density through a tunnel layer, such as an MgO layer, of the lower MTJ stack. The bottom NM layer may also serve as an additional boron drain conduit during the annealing processes. In certain of these devices, a non-magnetic spin conductor is used between the two MTJ stacks (e.g., Cu, CuN, Ag, AgSn etc.). During the manufacture of these devices, an in-situ stack deposition process is desired for stack integrity and to avoid an unexpected loss of spin conductance which may happen in an ex-situ process such as oxidation or CMP. However, with these wide based DMTJ devices, there is a need to harness a stop-etch on a, for example, Ag type of NM layer. There is also a need to control the body-centered cubic (e.g., CoFe) nucleation front.

The present invention relates, generally, to the field of semiconductor manufacturing, and more particularly to fabricating a double magnetic tunnel junction device fabricated with a polymer layer surrounding a sidewall spacer surrounding the DMTJ which includes 2 magnetic tunnel junctions separated by a spin conductor layer. In an embodiment, the sidewall spacer is removed prior to forming a blanket dielectric over the DMTJ. In an alternate embodiment the sidewall spacer remains during fabrication of a blanket dielectric over the DMTJ.

The polymer layer surrounds the sidewall spacer, which surrounds a stack of a metallic hard mask above an etch stop layer above the second MTJ stack above a spin conductor layer above the first MTJ stack. The polymer layer may enable preservation of the sidewall spacer along the stack, helping to enable a uniform size of the first MTJ stack and to prevent extrusion and attack of the spin conductor layer from subsequent processing steps.

In an embodiment, the first MTJ stack, the spin conducting layer and the second MTJ stack, an etch stop layer and a metallic hard mask may each be conformally formed. Patterning of the metallic hard mask, the etch stop layer and the second MTJ stack may be done. After conformal deposition of a sidewall dielectric, a polymer layer may be deposited and formed to remain preferably along vertical sidewalls of the patterned metallic hard mask, etch stop layer and second MTJ stack, and less deposition on an uppermost surface of the patterned metallic hard mask, etch stop layer and second MTJ stack. In an embodiment, the polymer layer may be deposited in the same chamber as patterning of the metallic hard mask, the etch stop layer and the second MTJ stack. Portions of the sidewall dielectric, along with portions of the spin conductor layer and portions of the first dielectric may be removed. The polymer layer may protect the spin conductor layer from extrusion and attack of subsequent fabrication steps. The polymer layer may help preserve thermal and stress characteristics surrounding the DMTJ. The first MTJ stack may have a diameter equal or greater to the combined diameter of the hard mask, the sidewall dielectric and the polymer layer, and the second MTJ stack may have a diameter comparable to the hard mask only. A dielectric may be conformally formed on the structure, followed by a first interlayer dielectric ("ILD"). Contact formation may continue following standard processes.

Figure 1:
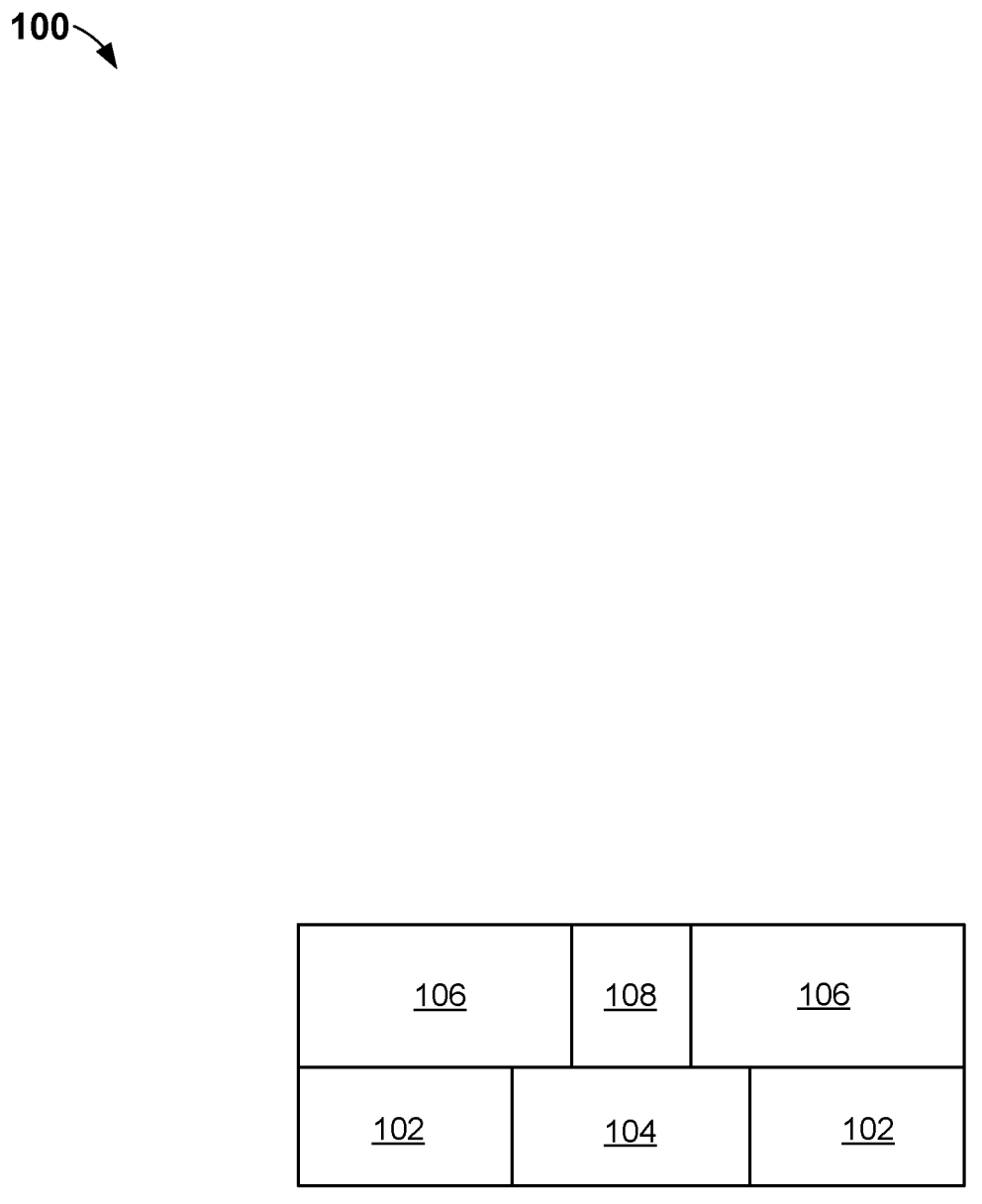

Embodiments of the present invention disclose a structure and a method of forming an DMTJ fabricated with a polymer layer surrounding a sidewall spacer surrounding the DMTJ are described in detail below by referring to the accompanying drawings in FIGS. 1-10, in accordance with an illustrative embodiment.

Referring now to FIG. 1, a semiconductor structure 100 (hereinafter "structure") at an intermediate stage of fabrication is shown according to an exemplary embodiment. FIG. 1 is a cross-sectional view of the structure 100.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer. As shown in FIG. 1, a first BEOL layer includes a BEOL dielectric layer 102 surrounding a BEOL metal layer 104. A second BEOL layer formed on the first BEOL layer includes via dielectric layer 106 and a via fill layer 108

The BEOL dielectric layer 102 may be formed by conformally depositing or growing a dielectric and performing an isotropic etch process. The BEOL dielectric layer 102 may include one or more layers. The BEOL dielectric layer 102 may be composed of, for example, silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

A first opening (not shown) may be formed in the BEOL dielectric layer 102 by, for example, reactive ion etching (ME), and stopping on a layer below the first BEOL layer for subsequent filling with the BEOL metal layer 104. The BEOL metal layer 104 may be formed within the first opening (not shown) in the BEOL dielectric layer 102, using known techniques. The BEOL metal layer 104 can include, for example, copper (Cu), tantalum nitride (TaN), tantalum (Ta), titanium (Ti), titanium nitride (TiN), or a combination thereof. The BEOL metal layer 104 can be formed by for example, chemical vapor deposition (CVD), physical vapor deposition (PVD), and atomic layer deposition (ALD) or a combination thereof.

A planarization process, such as, for example, chemical mechanical polishing (CMP), may be done to remove excess material from a top surface of the first BEOL layer of the structure 100 prior to forming the second BEOL layer, such that upper horizontal surfaces of the BEOL dielectric layer 102 and the BEOL metal layer 104 are coplanar.

The second BEOL layer is formed on the first BEOL layer. The second BEOL layer includes the via dielectric layer 106 and the via fill layer 108.

The via dielectric layer 106 may be formed by conformally depositing or growing a dielectric and performing an isotropic etch process. The via dielectric layer 106 may include one or more layers. The via dielectric layer 106 is formed above the BEOL dielectric layer 102 and the BEOL metal layer 104. The via dielectric layer 106 may be made of substantially the same material as the BEOL dielectric layer 102.

The via fill layer 108 is then formed within a second opening (not shown) in the via dielectric layer 106. The second opening (not shown) may be formed by, for example, reactive ion etching (ME), and stopping on the BEOL metal layer 104 of the first BEOL layer for subsequent filling with the via fill layer 108. In certain embodiments, the via fill layer 108 may include a material such as tungsten (W), copper (Cu), tantalum nitride (TaN), tantalum (Ta), titanium (Ti), titanium nitride (TiN), titanium oxide carbon nitride (TiOCN), tantalum oxide carbon (TaOCN), cobalt (Co), or a combination of these materials. The via fill layer 108 can be formed by for example, CVD, PVD and ALD or a combination thereof.

In particular, the via fill layer 108 is aligned with the BEOL metal layer 104, providing an electrical connection between the via fill layer 108 and the BEOL metal layer 104.

After the via fill layer 108 is formed, the structure is subjected to, for example, CMP to planarize the surface for further processing, such that upper horizontal surfaces of via dielectric layer 106 and the via fill layer 108 are coplanar. The structure including the BEOL layers shown in FIG. 1 is a starting structure upon which the MTJ stacks are to be formed.

Referring now to FIG. 2, the structure 100 is shown according to an exemplary embodiment. As shown in FIG. 2, magnetoresistive random-access memory ("MRAM") stack layers, an etch stop layer 116, a metallic hard mask 118 and a hard mask layer 120 are formed.

The MRAM stack layers include a first MTJ stack 110, a spin conductor layer 112 over the first MTJ stack and a second MTJ stack 114 over the spin conductor layer 112. Each of the MRAM stack layers may be conformally formed on the structure 100 using known techniques. The etch stop layer 116 may be formed on the MRAM stack layers. The metallic hard mask 118 may be formed on the etch stop layer 116. The hard mask layer 120 may be formed on the metallic hard mask 118. The first MTJ stack 110 may be referred to as a lower or bottom MTJ stack. The second MTJ stack 114 may be referred to as an upper or top MTJ stack.

In formation of either of the MTJ stacks, a first tunnel barrier layer is formed on top of the reference layer. In an embodiment, the first tunnel barrier layer is a barrier, such as a thin insulating layer or electric potential, between two electrically conducting materials. Electrons (or quasiparticles) pass through the tunnel barrier by the process of quantum tunneling. In certain embodiments, the first tunnel barrier layer includes at least one sublayer composed of MgO. It should be appreciated that materials other than MgO can be used to form the first tunnel barrier layer. The free layer is a magnetic free layer that is adjacent to the first tunnel barrier layer so as to be opposite the reference layer. The magnetic free layer has a magnetic moment or magnetization that can be flipped. The second tunnel barrier layer is formed on the free layer. In certain embodiments, the second tunnel barrier includes an outermost sublayer (or some other sublayer) comprised of the same material (e.g., MgO) as the first tunnel barrier layer. It should also be appreciated that either of the first MTJ stack 110 and the second MTJ stack 114 may include additional layers, omit certain layers, and each of the layers may include any number of sublayers. Moreover, the composition of layers and/or sublayers may be different between the first MTJ stack 110 and the second MTJ stack 114. In certain embodiments, the first MTJ stack 110 and the second MTJ stack 114 are formed by a self-aligned patterning process. However, in certain examples, the first MTJ stack 110 is not self-aligned with the second MTJ stack 114.

In general, with regard to the first MTJ stack 110 and the second MTJ stack 114, information is stored in the magnetic orientation of a free layer film in relation to that of the reference layer. The reference layer may be a single layer or a plurality of layers. In an embodiment, the reference layer of the MTJ stack is a synthetic antiferromagnetic ("SAF")

layer. In certain embodiments, the reference layer of the MTJ stack includes a plurality of sublayers (e.g., twenty or more sublayers).

The first MTJ stack 110 may be referred to as the reference layer and the second MTJ stack 114 may be referred to as the free layer. In an embodiment, the first MTJ stack 110 and the second MTJ stack may each include cobalt (Co), cobalt iron (CoFe), cobalt nickel (CoNi), cobalt iron boron (CoFeB) and cobalt platinum (CoPt), among other materials, in any combination.

The first MTJ stack 110 is separated from the second MTJ stack 114 by the spin conductor layer 112. The spin conductor layer 112 funnels spin from the first MTJ stack 110 to flip the free layer in the second MTJ stack 114. The spin conductor layer 112 may include any suitable conductive material in accordance with the embodiments described herein. Examples of suitable conductive materials include, but are not limited to, silver (Ag), silver-tin alloys (AgSn), gold (Au), copper (Cu) and copper nitride (CuN), or any material with relatively high spin diffusion lengths, for example greater than 10 nm. In an embodiment, the spin conductor layer 112 may have a thickness of approximately 50 nm.

In an embodiment, the spin conductor layer 112 may be a non-magnetic spin diffusion layer. In an embodiment, the second MTJ stack 114 includes a top reference or pinned layer on an upper layer, a tunneling oxide in a middle layer and a magnetic free layer at a bottom layer, all within the second MTJ stack 114.

The etch stop layer 116 is deposited on top of the second MTJ stack 114. The etch stop layer 116 can be composed of, for example, ruthenium (Ru). The etch stop layer 116 can be composed of, for example, ruthenium (Ru) and may be deposited utilizing a conventional deposition process such as, for example, CVD, plasma enhanced chemical vapor deposition (PECVD), PVD or ALD.

The metallic hard mask 118 is formed on the etch stop layer 116. The metallic hard mask 118 may be composed of, for example, tungsten (W), tantalum nitrate (TaN) or titanium nitride (TiN). The metallic hard mask 118 may be one or more layers. The metallic hard mask 118 may be deposited utilizing a conventional deposition process such as, for example, CVD, PECVD, PVD or ALD.

The hard mask layer 120 is formed on the metallic hard mask 118. The hard mask layer 120 may be a dielectric and/or organic hard mask layer. The hard mask layer 120 may be composed of, any organic planarization layer material (OPL) or dielectric material, such as, for example, a self-planarizing organic material that includes carbon, hydrogen, oxygen, and optionally nitrogen, fluorine, silicon, a standard $C_xH_y$ polymer, silicon nitride and/or silicon oxynitride, silicon dioxide or a photoresist. The hard mask layer 120 may be deposited utilizing a conventional deposition process such as, for example, CVD, PECVD, PVD or ALD.

The etch stop layer 116, the metallic hard mask 118 and the hard mask layer 120 may be patterned in one or more steps by lithography and RIE, selectively removing portions of the etch stop layer 116, the metallic hard mask 118 and the hard mask layer 120, such that the second MTJ stack 114 and layers below the second MTJ stack 114 are not etched. Remaining portions of the etch stop layer 116, the metallic hard mask 118 and the hard mask layer 120 may be vertically aligned.

Figure 3:
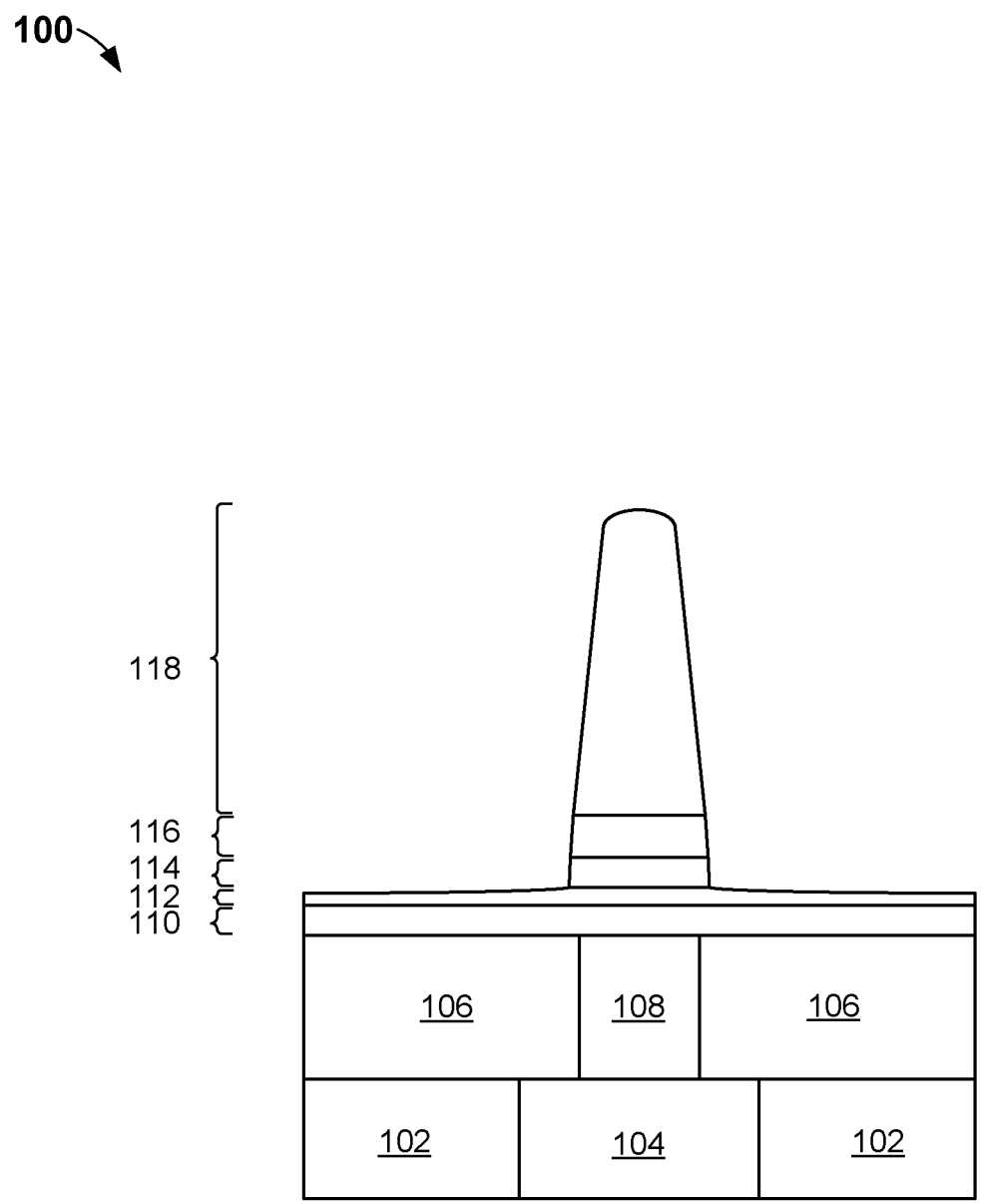
FIG. 3 illustrates patterning of several layers, according to an exemplary embodiment.

Referring now to FIG. 3, the structure 100 is shown according to an exemplary embodiment. As shown in FIG. 3, patterning of several layers is performed.

The second MTJ stack 114 may be patterned using known techniques, such as for example, ion beam etch (IBE) or RIE. The patterning may be performed in one or more steps. The patterning may remove the hard mask layer 120, and portions of the metallic hard mask 118 and the etch stop layer 116. The resulting structure may include a slightly curved upper surface of the metallic hard mask 118 and include vertically aligned side surfaces of the metallic hard mask 118, the etch stop layer 116 and the second MTJ stack 114. The vertically aligned side surfaces of the metallic hard mask 118, the etch stop layer 116 and the second MTJ stack 114 may have a vertical or nearly vertical profile. The resulting structure has a tapered shape with a fairly consistent slope.

Patterning of the second MTJ stack 114 may remove a portion of the spin conductor layer 112, resulting in a horizontal or nearly horizontal profile, which is minimally etched closer to the structure of the metallic hard mask 118, the etch stop layer 116 and the second MTJ stack 114, and etched a slightly greater amount further away from the structure of the metallic hard mask 118, the etch stop layer 116 and the second MTJ stack 114. The resulting spin conductor layer 112 is slightly thicker closer to the structure of the metallic hard mask 118, the etch stop layer 116 and the second MTJ stack 114 and slightly thinner further away. An upper surface of the first MTJ stack 110 may remain covered by the spin conductor layer 112.

The etched spin conducting layer 112 may have a curved cross-sectional profile near where the spin conducting layer 112 meets the second MTJ stack 114. At this stage in the manufacturing process, the critical dimension (CD) of the second MTJ stack 114 is less than that of the first MTJ stack 110. Moreover, the CD of the spin conducting layer 112 gradually changes throughout the thickness of the layer. In certain embodiments, an air-break or controlled in-situ oxidation may be utilized to reduce partial electrical shorts. The shape of the combination of the metallic hard mask 118, the etch stop layer 116 and the second MTJ stack 114 has a tapered shape with a fairly consistent slope (i.e., at least substantially until you reach the spin conducting layer 112 where the CD gradually increases by the curved portion thereof). However, it should be appreciated that in other embodiments, the sidewalls of the of the combination of the metallic hard mask 118, the etch stop layer 116 and the second MTJ stack 114 have a vertical (or nearly vertical) profile.

Figure 4:
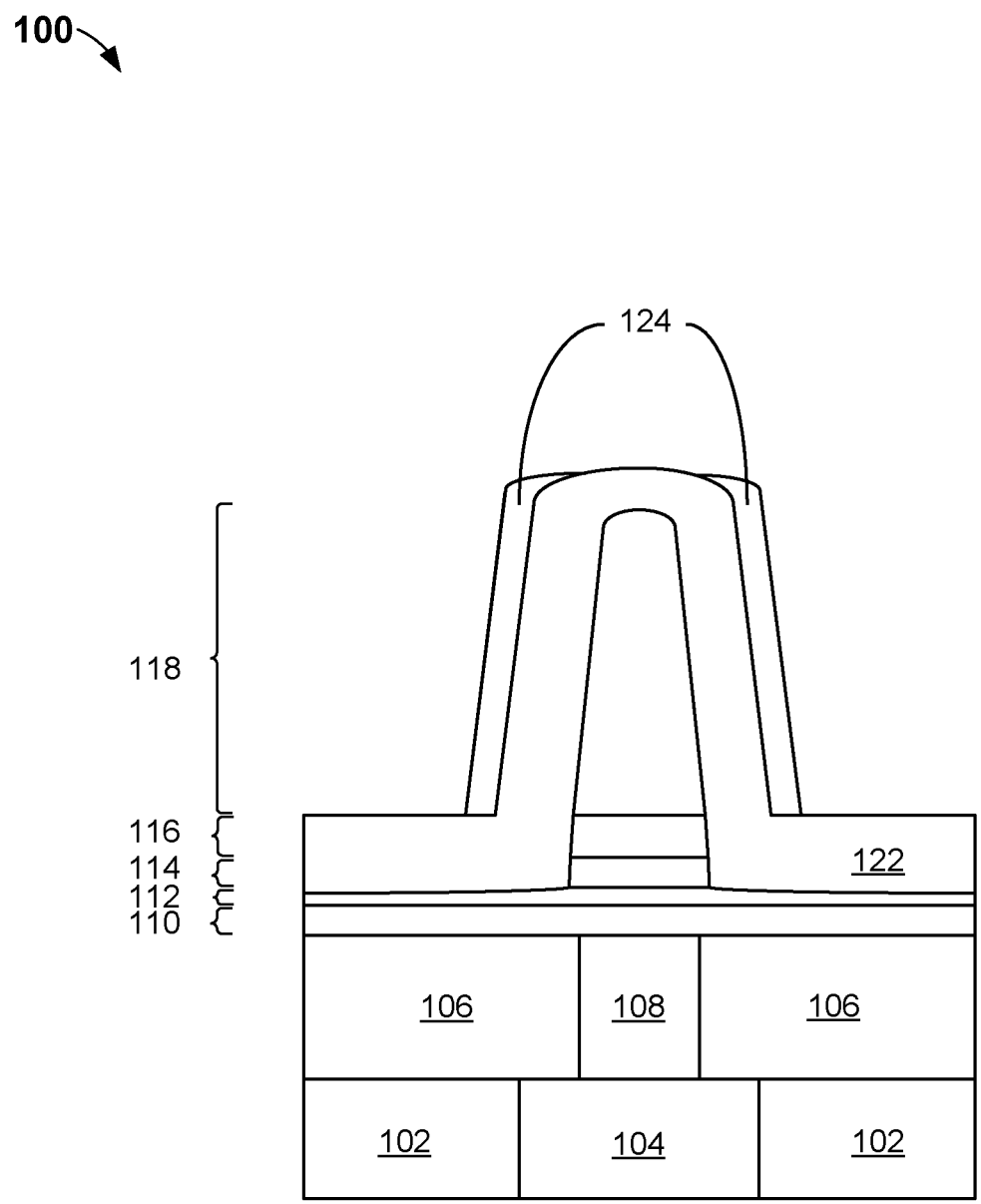
FIG. 4 illustrates forming a dielectric and a polymer layer, according to an exemplary embodiment.

Referring now to FIG. 4, the structure 100 is shown according to an exemplary embodiment. As shown in FIG. 4, a sidewall dielectric 122 and a polymer layer 124 may be formed.

The sidewall dielectric 122 may be conformally formed on an upper surface of the structure 100, on an exposed upper surface of the spin conductor layer 112, on vertical side surfaces of the second MTJ stack 114, the etch stop layer 116 and the metallic hard mask 118, and on an upper surface of the metallic hard mask 118. The sidewall dielectric 122 may be formed by PVD, ALD, PECVD, among other methods. The material of the sidewall dielectric 122 may include silicon nitride (SiN), aluminum oxide ($AlO_x$), titanium oxide ($TiO_x$), silicon oxide ($SiO_x$), boron nitride (BN), silicon boron carbonitride (SiBCN), or any combination thereof.

In a preferred embodiment, the sidewall dielectric 122 may have an optional pre-treatment with plasma oxygen (O), hydrogen (H), nitrogen (N) or ammonia ($NH_3$), or any combination thereof.

The polymer layer 124 may be conformally formed on an upper surface of the structure 100, on an exposed upper surface of the sidewall dielectric 122. The polymer layer 124 may be formed in the same chamber that was used to pattern the metallic hard mask 118, the etch stop layer 116 and the second MTJ stack 114 using an appropriate chemistry, such as $CF_x/H_2$ or $C_xH_yF_z$, and may contain carbon (C), fluoride (F) and hydrogen (H).

Portions of the polymer layer 124 may be removed, for example by a reactive ion etching (RIE), or plasma etch process, whereby ion bombardment facilitates selective removal from the horizontal surface relative to the vertical side surfaces. The chemistry used in this process may be N2/O2 or N2/H2, where N2 is the dominant component. The polymer layer 124 may be removed from an upper curved surface of the sidewall dielectric 122 above the metallic hard mask 118 and may be removed from an upper horizontal surface of the sidewall dielectric 122 above the spin conductor layer 112.

A resulting polymer layer 124 may have less deposition in areas of increased ion-bombardment, such as on horizontal surfaces. In an embodiment, the polymer layer 124 remains on vertical side surfaces of the sidewall dielectric 122.

Figure 5:
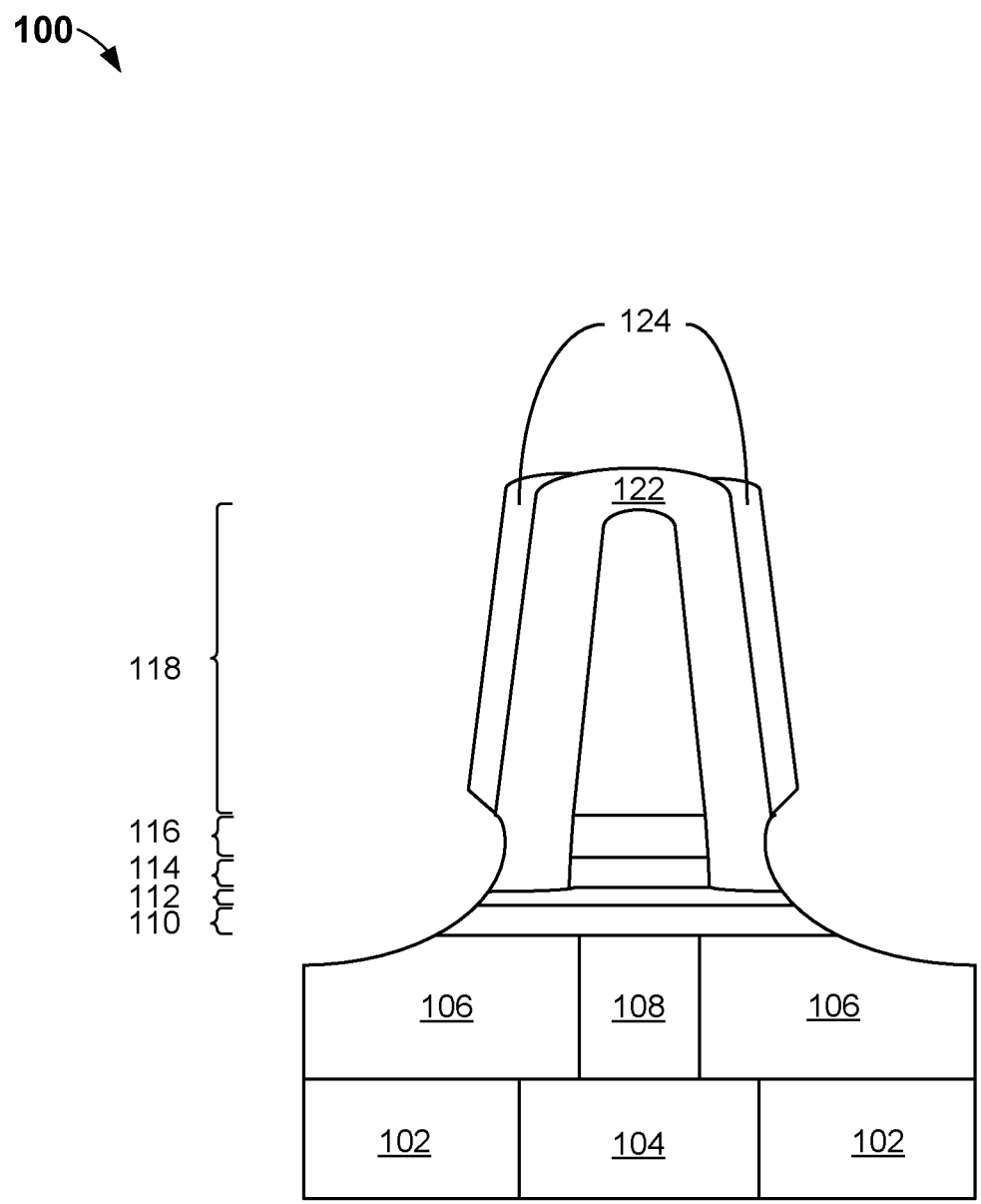
FIG. 5 illustrates selectively removing portions of the hard mask and polymer layer, according to an exemplary embodiment.

Referring now to FIG. 5, the structure 100 is shown according to an exemplary embodiment. As shown in FIG. 5, portions of the sidewall dielectric 122, portions of the spin conductor layer 112, portions of the first MTJ stack 110 and portions of the via dielectric layer 106 may be removed.

Removal of the portions of the sidewall dielectric 122, the portions of the spin conductor layer 112, the portions of the first MTJ stack 110 and the portions of the via dielectric layer 106 may be via IBE or RIE, may be performed in one or more steps, and is selective to the polymer layer 124. The sidewall dielectric 122 may remain surrounding vertical side surfaces and an upper surface of the metallic hard mask 118, vertical side surfaces of the etch stop layer 116 and vertical side surfaces of the second MTJ stack 114.

Prior to this step, the first MTJ stack 110 was conformally layered on the via dielectric layer 106 and had not been subject to a removal process, while the spin conductor layer 112 was conformally layered on the via dielectric layer 106 with minimal patterning performed. As a result of this step, portions of the spin conductor layer 112 and portions of the first MTJ stack 110 have been removed, exposing an upper surface of the via dielectric layer 106. Side surfaces of the spin conductor layer 112 and the first MTJ stack 110 may align with side surfaces of the sidewall dielectric 122 in a nearly vertical alignment which an upper portion which is slanted slighted inwards towards the stack of the metallic hard mask 118, the second MTJ stack 110 and the etch stop layer 116.

The spin conductor layer 112, comprising a material non-susceptible to isotropic etching by RIE or IBE, may be minimally etched during the patterning. The first MTJ stack 110 is wider than the second MTJ stack 114 as shown in FIG. 5. In an embodiment, the first MTJ stack 110 may be twice as wide as the second MTJ stack 114 in the structure 100. In an embodiment, the first MTJ stack 110 and the second MTJ stack may each have a vertical thickness of approximately 20 nm, the sidewall dielectric 122 may have a thickness of approximately 40 nm and the polymer layer 124 may have a thickness up to approximately 40 nm.

A resulting upper surface of the via dielectric layer 106 may be horizontal or nearly horizontal, which a greater thickness of the via dielectric layer 106 towards the stack of the metallic hard mask 118, the etch stop layer 116 and the second MTJ stack 114, and a lower thickness of the via dielectric layer 106 away from the stack of the metallic hard mask 118, the second MTJ stack 114 and the etch stop layer 116.

The polymer layer 124 may protect the sidewall dielectric 122 during removal of the portions of the spin conductor layer 112, the portions of the first MTJ stack 110 and the portions of the via dielectric layer 106, surrounding the stack of the metallic hard mask 118, the second MTJ stack 114 and the etch stop layer 116.

Figure 6:
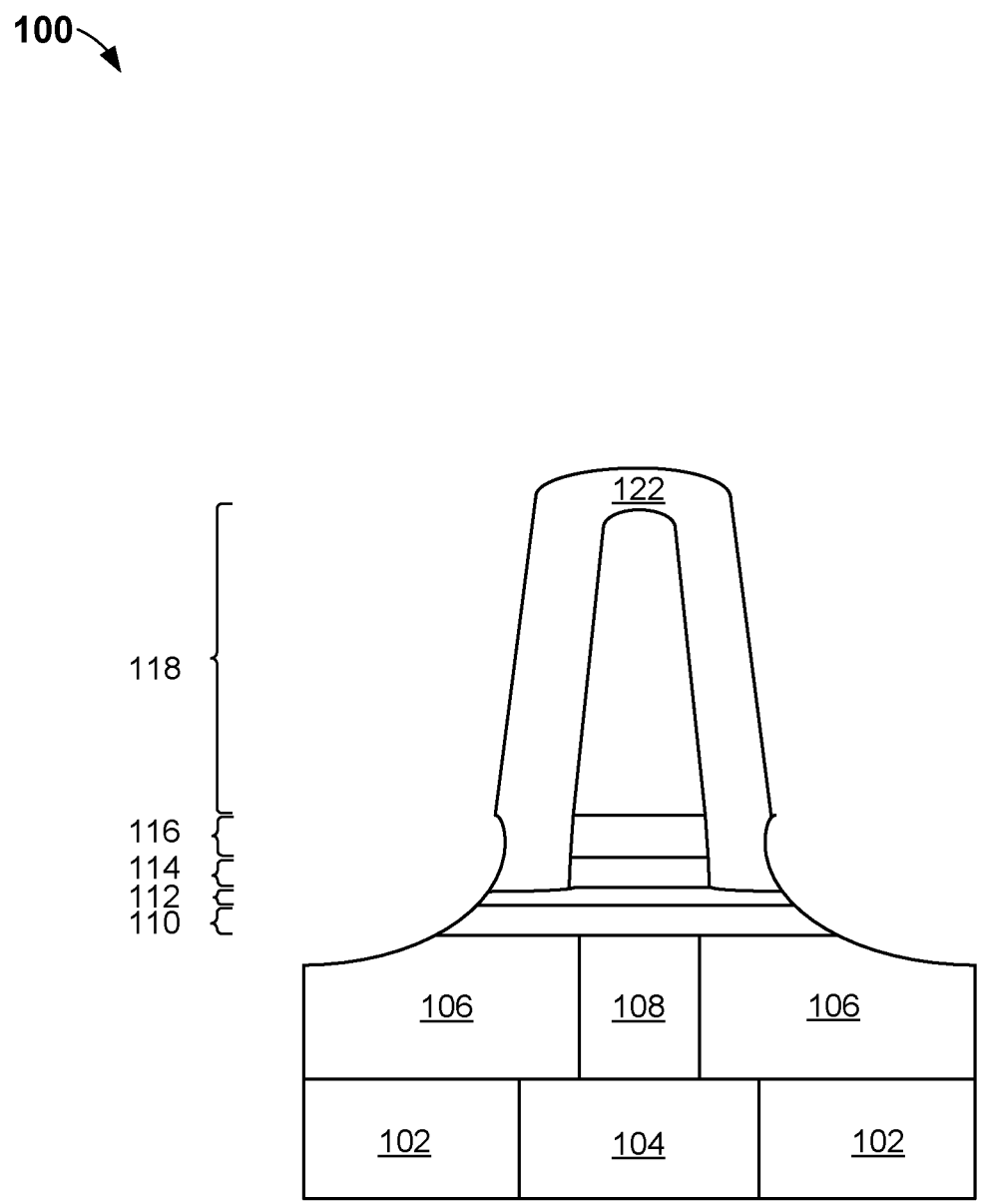
FIG. 6 illustrates selectively removing remaining portions of the polymer layer, according to an exemplary embodiment.

Referring now to FIG. 6, the structure 100 is shown according to an exemplary embodiment. As shown in FIG. 6, the polymer layer 124 may be removed.

Removal of the polymer layer 124 may be selectively removed via a selective etch process, selective to the sidewall dielectric 122, the spin conductor layer 112, the first MTJ stack 110 and the via dielectric layer 106.

The thermal and stress characteristics of the first MTJ stack 110 are preserved due to the selective etch conditions used for removal of the polymer layer 124, such as downstream plasma, zero applied bias (lower ion bombardment), and non-oxidizing chemistry such as $N_2/H_2$.

Figure 7:
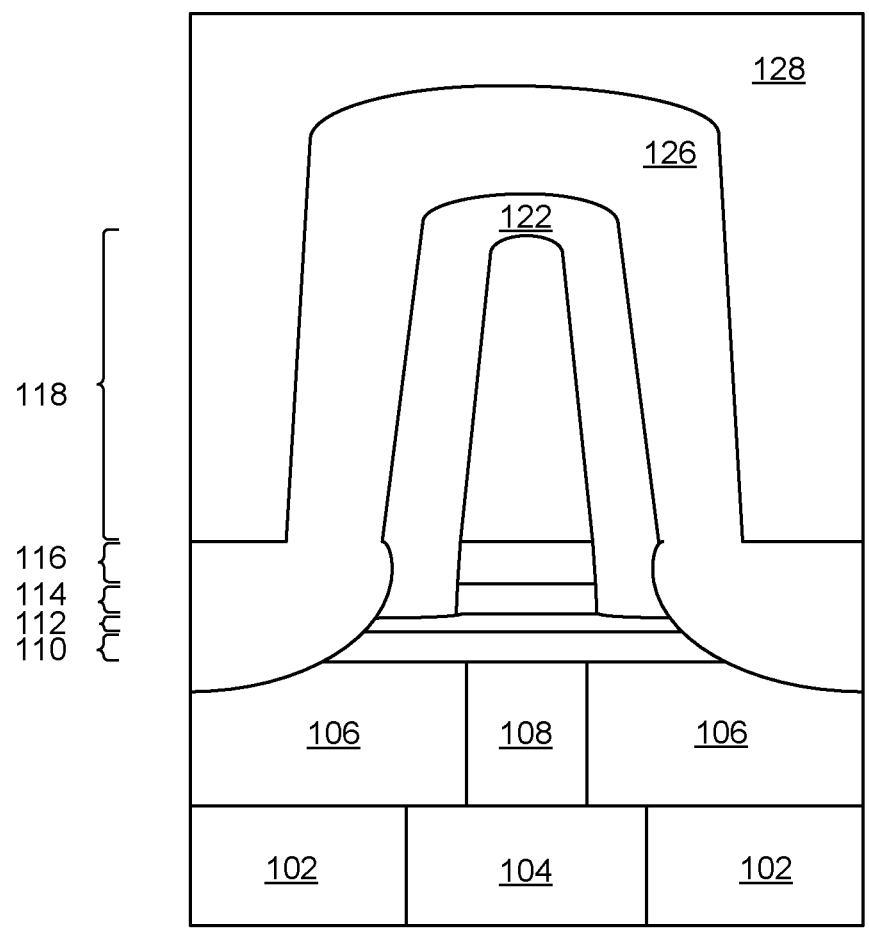
FIG. 7 illustrates forming a dielectric and an interlevel dielectric, according to an exemplary embodiment.

Referring now to FIG. 7, the structure 100 is shown according to an exemplary embodiment. As shown in FIG. 7, a first dielectric 126 and a first interlayer dielectric, (hereinafter "first ILD") 128 may be formed.

The first dielectric 126 may conformally cover the via dielectric layer 106 over the BEOL dielectric layer 102. Vertical portions of the first dielectric 126 may align with sidewalls of the sidewall dielectric 122, outer sidewalls of the spin conductor layer 112 and sidewalls of the first MTJ stack 110. The first dielectric 126 may include one or more layers. The first dielectric 126 may be formed via PVD, ALD or PECVD. The first dielectric 126 may be composed of, for example silicon nitride (SiN), aluminum oxide ($AlO_x$), titanium oxide ($TiO_x$), silicon oxide ($SiO_x$), boron nitride (BN), silicon boron carbonitride (SiBCN), or any combination thereof. In a preferred embodiment, the first dielectric 126 may have an optional pre-treatment with plasma oxygen (O), hydrogen (H), nitrogen (N) or ammonia ($NH_3$), or any combination thereof.

The first ILD 128 may cover the first dielectric 126 over the via dielectric layer 106 over the BEOL dielectric layer 102. Vertical portions of the first ILD 128 may align with outer sidewalls of the first dielectric 126. The first ILD 128 may be formed by PECVD. The first ILD 128 may include one or more layers. The first ILD 128 may be composed of, for example, silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

Figure 8:
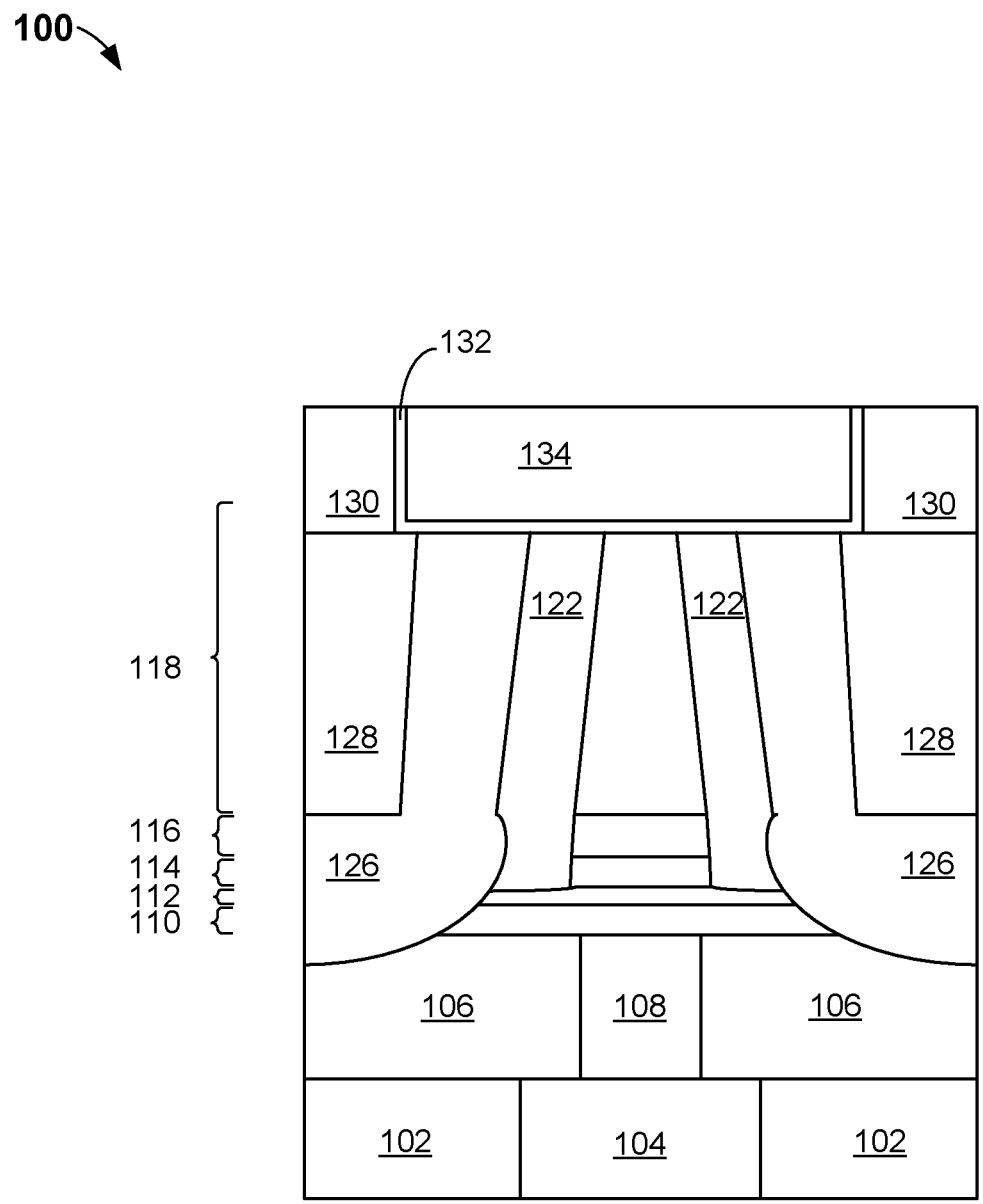
FIG. 8 illustrates forming a bit line, according to an exemplary embodiment.

Referring now to FIG. 8, the structure 100 is shown according to an exemplary embodiment. As shown in FIG. 8, a second interlayer dielectric, (hereinafter "second ILD") 130, a liner 132 and a bit-line metal 134 may be formed.

A chemical mechanical polishing (CMP) technique may be used to remove excess material and polish upper surfaces of the structure 100 such that upper horizontal surfaces of the first ILD 128, the first dielectric 126, the sidewall dielectric 122 and the metallic hard mask 118 and are coplanar.

The second ILD 130 may be conformally formed on an upper surface of the structure 100, covering the first ILD 128, the first dielectric 126, the sidewall dielectric 122 and the metallic hard mask 118.

The second ILD 130 may be formed by conformally depositing or growing a dielectric and performing an isotropic etch process. The second ILD 130 may include one or more layers. The second ILD 130 may be composed of, for example, silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

A third opening (not shown) may be formed in the second ILD 130. The third opening (not shown) may align vertically with the MTJ stack of the metallic hard mask 118, the etch stop layer 116, the second MTJ stack 114, the spin conductor layer 112 and the first MTJ stack 110. The opening (not shown) may be formed via an etch selective to the first ILD 128, the first dielectric 126, the sidewall dielectric 122 and the metallic hard mask 118.

The liner 132 may be formed along a lower surface and along vertical side surfaces of the third opening (not shown). The liner 132 may be formed after several processes, including for example, conformally depositing or growing a dielectric and performing an isotropic etch process. The liner 132 may include any dielectric material such as silicon nitride and may include a single layer or may include multiple layers of dielectric material.

The bit-line metal 134 may be deposited in a remaining portion of the third opening (not shown) using typical deposition techniques, for example, ALD, MLD and CVD. Materials for the bit-line metal 134 may include, but are not limited to, copper (Cu), tantalum nitride (TaN), tantalum (Ta), titanium (Ti), titanium nitride (TiN), or a combination thereof.

After forming the bit-line metal 134, a chemical mechanical polishing (CMP) technique may be used to remove excess material and polish upper surfaces of the structure 100 such that upper horizontal surfaces of the second ILD 130, the liner 132 and the bit-line metal 134 are coplanar.

The resulting structure 100 contains a wide-base MTJ, or double MTJ, with both the spin conductor layer 112 and the first MTJ stack 110 wider than each the second MTJ stack 114, the etch stop layer 116 and the metallic hard mask 118.

Figure 9:
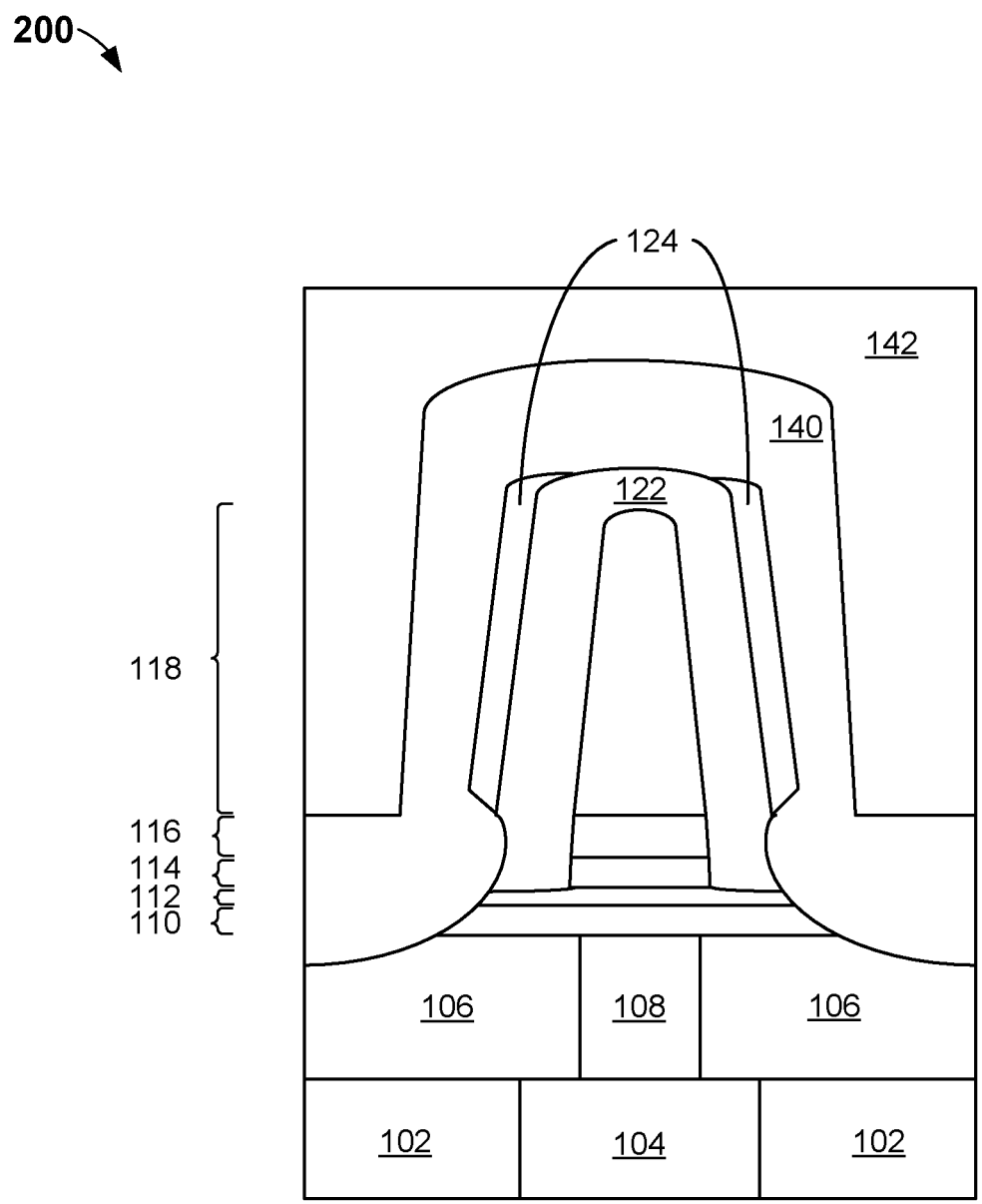
FIG. 9 illustrates an alternate embodiment, according to an exemplary embodiment.

Referring now to FIG. 9, a structure 200 is shown according to an exemplary embodiment. The structure 200 is an alternate embodiment of forming a DMTJ. The structure 200 may be formed from subsequent processing of the structure 100 as described above in FIG. 5. As shown in FIG. 9, a second dielectric 140 and a third interlayer dielectric, (hereinafter "third ILD") 142 may be formed.

The second dielectric 140 may cover the via dielectric layer 106 over the BEOL dielectric layer 102. Vertical portions of the dielectric 140 may align with sidewalls of the sidewall dielectric 122, outer sidewalls of the spin conductor layer 112 and sidewalls of the first MTJ stack 110. The second dielectric 140 may include one or more layers. The second dielectric 140 may be formed via PVD, ALD or PECVD. The second dielectric 140 may be composed of, for example silicon nitride (SiN), aluminum oxide (AlOx), titanium oxide (TiOx), silicon oxide (SiOx), boron nitride (BN), silicon boron carbonitride (SiBCN), or any combination thereof. In a preferred embodiment, the second dielectric 140 may have an optional pre-treatment with plasma oxygen (O), hydrogen (H), nitrogen (N) or ammonia (NH₃), or any combination thereof.

The third ILD 142 may cover the second dielectric 140 over the via dielectric layer 106 over the BEOL dielectric layer 102. Vertical portions of the third ILD 142 may align with outer sidewalls of the second dielectric 140. The third ILD 142 may be formed by PECVD. The third ILD 142 may include one or more layers. The third ILD 142 may be composed of, for example, silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

Figure 10:
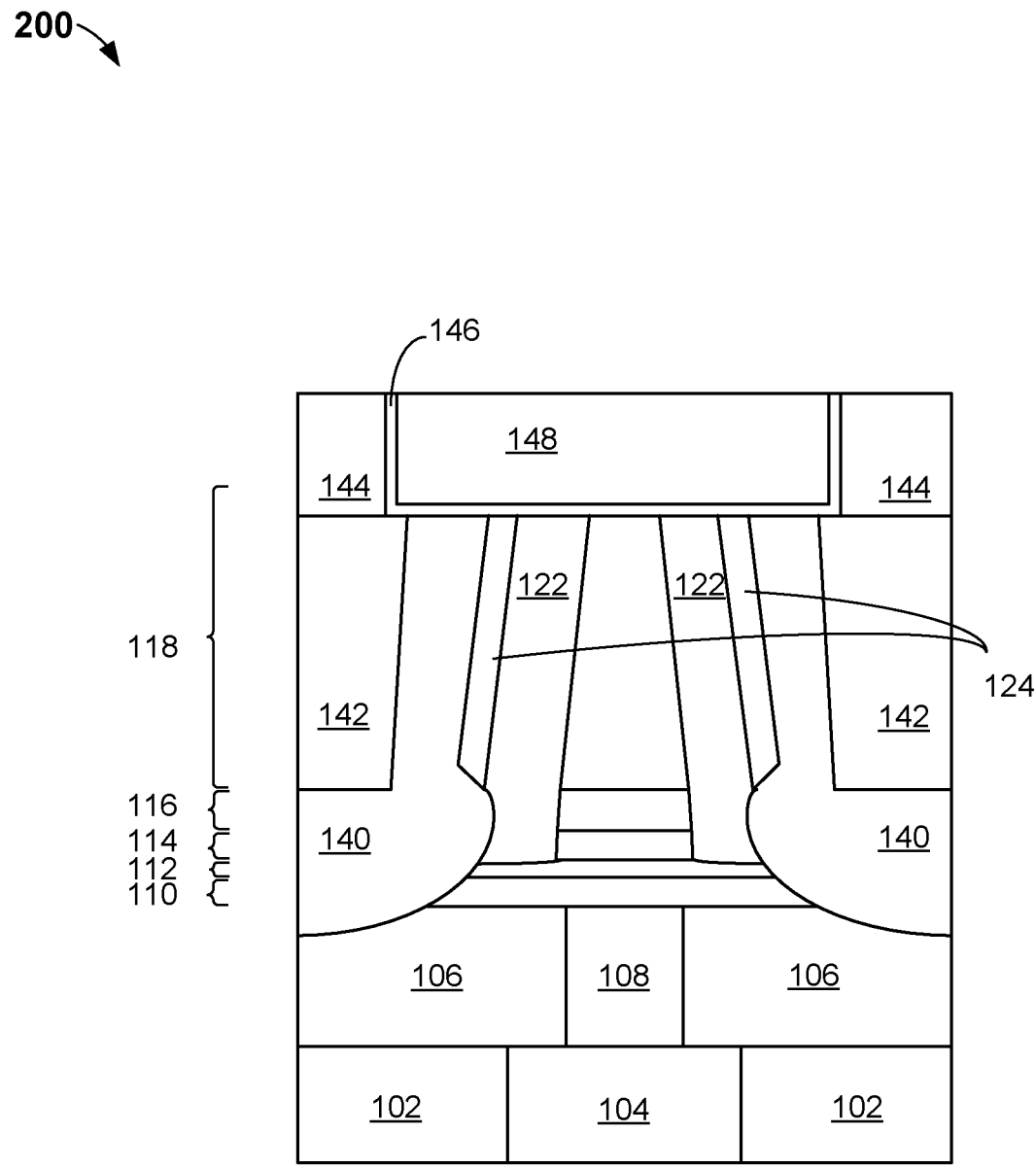
FIG. 10 illustrates forming a dielectric and a bit line, according to an exemplary embodiment.

Referring now to FIG. 10, the structure 200 is shown according to an exemplary embodiment. As shown in FIG. 10, a fourth interlayer dielectric, (hereinafter "fourth ILD") 144, a liner 146 and a bit-line metal 148 may be formed.

A chemical mechanical polishing (CMP) technique may be used to remove excess material and polish upper surfaces of the structure 200 such that upper horizontal surfaces of the third ILD 142, the second dielectric 140, the polymer layer 124, the sidewall dielectric 122 and the metallic hard mask 118 and are coplanar.

The fourth ILD 144 may be conformally formed on an upper surface of the structure 200, covering the third ILD 142, the second dielectric 140, the polymer layer 124, the sidewall dielectric 122 and the metallic hard mask 118.

The fourth ILD 144 may be formed by conformally depositing or growing a dielectric and performing an isotropic etch process. The fourth ILD 144 may include one or more layers. The fourth ILD 144 may be composed of, for example, silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

A fourth opening (not shown) may be formed in the fourth ILD 144. The fourth opening (not shown) may align vertically with the MTJ stack of the metallic hard mask 118, the etch stop layer 116, the second MTJ stack 114, the spin conductor layer 112 and the first MTJ stack 110. The fourth opening (not shown) may be formed via an etch selective to the third ILD 142, the second dielectric 140, the polymer layer 124, the sidewall dielectric 122 and the metallic hard mask 118.

The liner 146 may be formed along a lower surface and along vertical side surfaces of the fourth opening (not shown). The liner 146 may be formed after several processes, including for example, conformally depositing or growing a dielectric and performing an isotropic etch process. The liner 146 may include any dielectric material such as silicon nitride and may include a single layer or may include multiple layers of dielectric material.

The bit-line metal 148 may be deposited in a remaining portion of the opening (not shown) using typical deposition techniques, for example, ALD, MLD and CVD. Materials for the bit-line metal 148 may include, but are not limited to, copper (Cu), tantalum nitride (TaN), tantalum (Ta), titanium (Ti), titanium nitride (TiN), or a combination thereof.

After forming the bit-line metal 148, a chemical mechanical polishing (CMP) technique may be used to remove excess material and polish upper surfaces of the structure 200 such that upper horizontal surfaces of the fourth ILD 144, the liner 146 and the bit-line metal 148 are coplanar.

The resulting structure 200 contains a wide-base MTJ, or double MTJ, with both the spin conductor layer 112 and the first MTJ stack 110 wider than each the second MTJ stack 114, the etch stop layer 116 and the metallic hard mask 118, where the polymer layer 124 surrounds the sidewall dielectric 122 surrounding the DMTJ.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a second magnetic tunnel junction stack above and aligned with a spin conductor layer above and aligned with a first magnetic junction stack, a sidewall dielectric surrounding the second magnetic tunnel junction stack, wherein a vertical side surface of the sidewall dielectric is substantially flush with vertical side surfaces of the spin conductor layer and the first magnetic junction stack;
an etch stop layer above and substantially flush with the second magnetic tunnel junction stack; and
a metallic hard mask above and with aligned the etch stop layer, wherein vertical sidewalls of the metallic hard mask, the etch stop layer and the second magnetic tunnel junction stack are substantially flush;
a lower horizontal surface of the sidewall dielectric directly touches a portion of an upper horizontal surface of the spin conductor layer.

2. The semiconductor device according to claim 1, further comprising:
an interlevel dielectric surrounding the sidewall dielectric.

3. The semiconductor device according to claim 1, wherein
a diameter of the first MTJ stack is greater than a combined diameter of the second MTJ stack and the sidewall dielectric.

4. The semiconductor device according to claim 1, wherein
a diameter of the first MTJ stack is greater than a combined diameter of the second MTJ stack, the sidewall dielectric and a polymer layer surrounding the sidewall dielectric.

5. The semiconductor device according to claim 1, further comprising:
a polymer layer surrounding the sidewall dielectric.

6. The semiconductor device according to claim 5, wherein
the polymer layer comprising CxHyFz.

7. A semiconductor device comprising:
a second magnetic tunnel junction stack above and aligned with a spin conductor layer above and aligned with a first magnetic junction stack, a sidewall dielectric surrounding the second magnetic tunnel junction stack, wherein a vertical side surface of the sidewall dielectric is aligned with vertical side surfaces of the spin conductor layer and the first magnetic junction stack;
an etch stop layer above and aligned with the second magnetic tunnel junction stack;
a metallic hard mask above and with aligned the etch stop layer, wherein vertical side surfaces of the etch stop layer and the metallic hard mask are aligned with vertical sidewalls of the second magnetic tunnel junction stack; and
a bit line metal above and aligned with the metallic hard mask.

8. The semiconductor device according to claim 7, further comprising:
an interlevel dielectric surrounding the sidewall dielectric.

9. The semiconductor device according to claim 7, wherein
a lower horizontal surface of the sidewall dielectric directly touches to portion of an upper horizontal surface of the spin conductor layer.

10. The semiconductor device according to claim 7, wherein
a diameter of the first MTJ stack is greater than a combined diameter of the second MTJ stack and the sidewall dielectric.

11. The semiconductor device according to claim 7, wherein
a diameter of the first MTJ stack is greater than a combined diameter of the second MTJ stack, the sidewall dielectric and a polymer layer surrounding the sidewall dielectric.

12. The semiconductor device according to claim 7, further comprising:
a polymer layer surrounding the sidewall dielectric.

13. The semiconductor device according to claim 12, wherein
the polymer layer comprising CxHyFz.

14. A semiconductor device comprising:
a second magnetic tunnel junction stack above and aligned with a spin conductor layer above and aligned with a first magnetic junction stack, a sidewall dielectric surrounding the second magnetic tunnel junction stack, wherein a vertical side surface of the sidewall dielectric is aligned with vertical side surfaces of the spin conductor layer and the first magnetic junction stack;
an etch stop layer above and aligned with the second magnetic tunnel junction stack; and
a metallic hard mask above and with aligned the etch stop layer, wherein vertical side surfaces of the etch stop layer and the metallic hard mask are aligned with vertical sidewalls of the second magnetic tunnel junction stack.

15. The semiconductor device according to claim 14, further comprising:
an interlevel dielectric surrounding the sidewall dielectric.

16. The semiconductor device according to claim 14, wherein
a lower horizontal surface of the sidewall dielectric is directly adjacent to a portion of an upper horizontal surface of the spin conductor layer.

17. The semiconductor device according to claim 14, wherein
a diameter of the first MTJ stack is greater than a combined diameter of the second MTJ stack and the sidewall dielectric.

18. The semiconductor device according to claim 14, wherein
a diameter of the first MTJ stack is greater than a combined diameter of the second MTJ stack, the sidewall dielectric and a polymer layer surrounding the sidewall dielectric.

19. The semiconductor device according to claim 14, further comprising:

a polymer layer surrounding the sidewall dielectric.

20. The semiconductor device according to claim 19, wherein the polymer layer comprising $C_xH_yF_z$.

* * * * *